United States Patent [19]

Hidaka et al.

[11] Patent Number: 5,011,817

[45] Date of Patent: Apr. 30, 1991

[54] MAGNETIC MEMORY USING SUPERCONDUCTOR RING

[75] Inventors: Yasuharu Hidaka; Takashi Inoue, both of Tokyo, Japan

[73] Assignee: NEC Corporation, Tokyo, Japan

[21] Appl. No.: 302,673

[22] Filed: Jan. 27, 1989

[30] Foreign Application Priority Data

Jan. 29, 1988 [JP] Japan .................................. 63-20606
Jan. 29, 1988 [JP] Japan .................................. 63-20607

[51] Int. Cl.⁵ .............................................. G11C 11/44
[52] U.S. Cl. ......................................... 505/1; 365/161; 365/162; 365/160; 505/700; 505/704; 505/832; 505/833; 357/5
[58] Field of Search .................. 365/160, 161, 162; 505/700, 702–704, 701, 831–838, 861–862; 357/5

[56] References Cited

U.S. PATENT DOCUMENTS

| | | | |
|---|---|---|---|
| 3,441,915 | 4/1969 | Hug | 365/160 |
| 3,626,391 | 12/1971 | Anacker | 505/832 |
| 4,494,131 | 1/1985 | Ohta | 357/5 |
| 4,660,061 | 4/1987 | Sweeny et al. | 357/5 |

FOREIGN PATENT DOCUMENTS 58-143495 8/1983 Japan .................................. 365/162
61-175996 8/1986 Japan .................................. 365/161

OTHER PUBLICATIONS

IEEE Transactions of Magnetics, vol. MAG-15, No. 1, Jan. 79, pp. 486–487, "Weak-Link SQUIDs", by Jillie et al.
IBM Technical Disclosure Bulletin, vol. 20, No. 7, Dec. 77, pp. 2839–2840, "Josephson Memory Cell with Mag. Film", by Broom et al.
Electronic Products, Outlook, Jan. 11, 84, pp. 17–18, "Superconductive Logic Survives IBM Bailout", by Fanis.

Primary Examiner—Joseph A. Popek
Assistant Examiner—Alfonso Garcia
Attorney, Agent, or Firm—Burns, Doane, Swecker & Mathis

[57] ABSTRACT

A noble unit cell structure in a magnetic memory is disclosed, in which a ferromagnetic film is sandwiched between first and second wires at a cross-over area, and third and fourth wires are provided so as to sandwich the first wire. The third wire is contacted with the first wire so as to form a ring portion surrounding the ferromagnetic film and the second wire. The fourth wire is isolated from the first wire. At least the first, second and third wires are made of superconductive material. The ferromagnetic film has a uniaxial anisotropy along the second wire and its magnetization direction can be reversed by applying pulse currents to the second and fourth wires in an information writing process. In a reading process, the magnetization direction of the ferromagnetic film can be recognized by detecting either one of a superconductive state or a normal conductive state at the ring portion of the first and third wires. The conductive state of the ring portion is determined by a combination of a direction of an induced diamagnetic current in the ring portion, which is caused by tilting the magnetization direction of the ferromagnetic film, and a direction of a bias current in the first wire at the ring portion with a predetermined condition of critical currents for the first and third wires at the ring portion.

4 Claims, 6 Drawing Sheets

MAGNETIC MEMORY USING SUPERCONDUCTOR RING

BACKGROUND OF THE INVENTION

This invention relates to a magnetic memory and more particularly to a non-volatile, high-density, solid magnetic memory using superconductor.

The solid magnetic memory has high reliability due to a usage of no mechanical driving parts. The solid magnetic memory may be classified largely into two types: random access type and serial access type. The core memory is a typical one of the former type while the bubble memory is another typical one of the latter. In increasing the storage density, the random access type has a limit on the reduction in the cell size because a sensor is required for each bit. On the other hand, the serial access type can increase its storage density relatively easily but an increased access time accompanied by the increased storage density poses a serious problem. In storage devices such as bubble memory in which bubbles carrying information are moved, there is a drawback that the stability of information deteriorates as information is carried on the moving bubbles.

Considering these drawbacks and merits, it is desirable to achieve an enhanced density random access memory as the non-volatile solid magnetic memory, if the sensor problem is solved.

First, we will explain the basic operation of the random access memory using magnetic material by taking an example of the core memory which is representative of the random access memory. As the core material, a magnetic material is used whose magnetization curve has a square hysteresis as shown in FIG. 1. At a bias field intensity of $Hy=0$, the material has a stable residual magnetization in the positive direction at point A, and in the negative direction at point B. This means the material has a bistable characteristic and the two magnetization directions can be assigned to "1" and "0", respectively, of binary number allowing the cores to be used as a storage device.

In actual devices, as shown in FIG. 2, ring cores 10 are formed of this magnetic material and three conductor wires are passed through each of the cores, with two of them arranged vertically and horizontally (along Y-axis and X-axis). The core 10 is placed at the intersection of the vertical and horizontal wires. These cores 10 are arranged in matrix, as shown in FIG. 2, to form a memory device. The principle of storing information is shown in FIG. 3. The direction 14 of magnetization of the ring core 10 is either set clockwise as shown in FIG. 3A, or counterclockwise as shown in FIG. 3B. Suppose the ring core at the initial state is magnetized, say, clockwise (negative). At a specified address, the magnetization of the core is reversed to the counterclockwise direction (positive). To achieve this, a pulse current is applied to the Y-wire and X-wire threading through the core to impose a magnetic field on the core.

The magnitude of the pulse current applied to the X-wire and Y-wire is so set that, when the magnetic field is produced by the pulse current of only the X-wire or Y-wire, the produced field will not be sufficient to reverse the magnetization direction from negative to positive. In other words, only when pulse magnetic fields produced by $Y_0$-wire and $X_0$-wire are both imposed on a core at the intersection of these two wires simultaneously, reverse magnetization occurs in the core. This is how a signal "1" is written into a desired address on the matrix.

To read the written information, pulses are applied to both $X_0$-wire and $Y_0$-wire simultaneously to reverse the magnetization of the selected core and a check is made whether a signal is output on a read wire 13. If a signal is produced, it is found that the address to which the pulses were sent contained information "1". However, this method performs a so-called destructive reading, i.e., reading information causes the contents of the core selected to become "0". If it is desired that the previous contents be retained, the core that was read from must be rewritten into with the same data. Besides, the core memory has another drawback that the bit cell size is large, making it difficult to increase the storage density.

A magnetic storage device is available which applies the above principle to a magnetic film to achieve higher storage density. The magnetic film may be formed of a soft magnetic material with a magnetic distortion constant of $\lambda=0$, such as 19% Fe-81% Ni alloy, which is deposited in circle on a substrate as shown in FIG. 4. The thickness of the film is about 1000 Å. During the vapor deposition process, a magnetic field is applied to give the film a uniaxial anisotropy in its plane such that the easy magnetization axis is in the direction of Y-axis.

In reversing the magnetization of the film, a field $Hy$ acting in parallel with the easy axis but in a direction opposite to the existing magnetization direction is produced by the $X_0$-wire, and at the same time a field $H_X$ perpendicular to the field $H_Y$ is produced by the $Y_0$-wire to cause magnetization reversal through the rotation of a magnetic moment. This makes use of the rapid rotation of a magnetic moment in reversing the magnetization in a very short time of the order of 10 ns. On the other hand, for the magnetic patterns 15 to which only $H_Y$ is applied, the reverse magnetization through the magnetic moment rotation, though started, takes time and cannot occur in a short time during which the $H_Y$ is imposed. That is, reverse magnetization occurs only when both two fields from X-axis wire and Y-axis wire are applied to the selected magnetic pattern 15' simultaneously. The fields $H_X$ and $H_Y$ are generated by applying a current to vertical and horizontal ribbons placed adjacent to the deposited film.

However, this device has drawbacks that the reverse magnetization of the cell gradually relaxes to the original direction, rendering the stored information unstable and that as the magnetic film patterns are reduced in size, the sense output becomes small, making the reading of information difficult.

SUMMARY OF THE INVENTION

The principal object of this invention is to provide a high-density, solid magnetic memory device which has improved stability of stored information and which makes the reading of stored information easy.

The high-density, solid magnetic memory device according to the invention employs patterns formed of superconductor materials to form a core ring and utilizes a diamagnetic current generated in the superconductor ring to enhance the stability of the stored information. Further, it also utilizes the state transition of the superconductor ring from superconducting state to normal-conducting state to facilitate the reading of stored information.

The magnetic memory device according to this invention is composed of:

a ferromagnetic film having a uniaxial anisotropy in the plane of the film;

first and second superconductor wires arranged to cross each other with the magnetic film interposed therebetween at the intersection;

a third superconductor wire placed in parallel with and in contact with the first superconductor wire in such a way as to hold the magnetic pattern and the second superconductor wire between them, the first and third superconductor wires forming a ring at the intersection with the second superconductor wire, the ring enclosing the magnetic film pattern and the second superconductor wire; and another conducting or superconductor wire arranged on, and in parallel with the first superconductor wire with an insulating layer between them.

DESCRIPTION OF THE PREFERRED EMBODIMENTS

Figure 1:
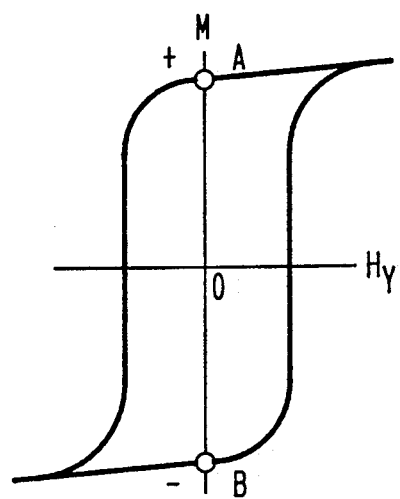
FIG. 1 is a characteristic diagram showing a magnetization curve when a magnetic material with a uniaxial anisotropy is subjected to a magnetic field which magnetizes it is an easy magnetization direction.
Figure 2:
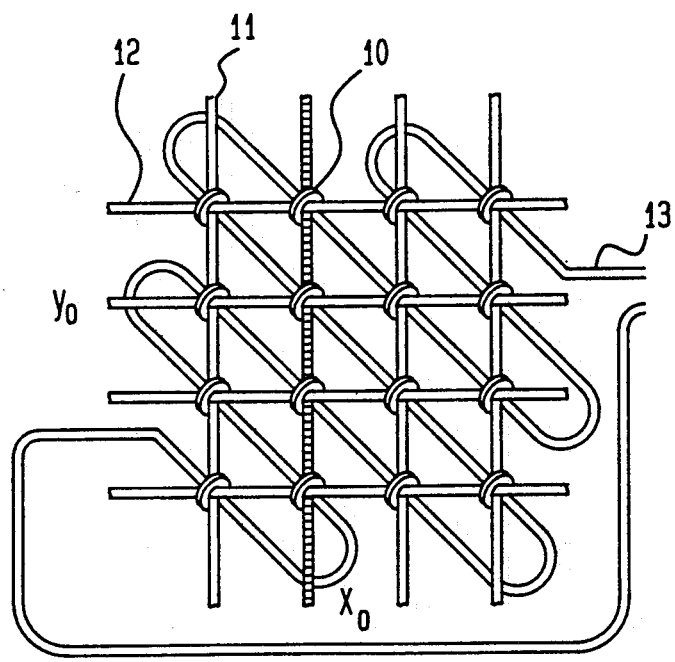
FIG. 2 is a perspective view showing the configuration of a conventional core memory.
Figure 3A:
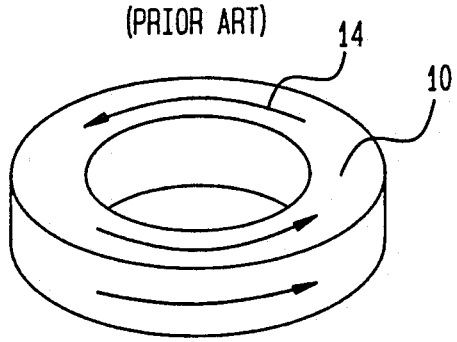
FIGS. 3A and 3B are perspective views showing the magnetized states of cores.
Figure 3B:
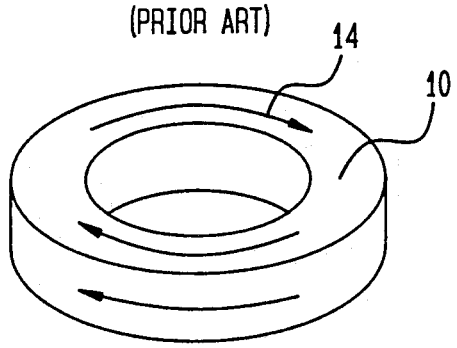
Figure 4:
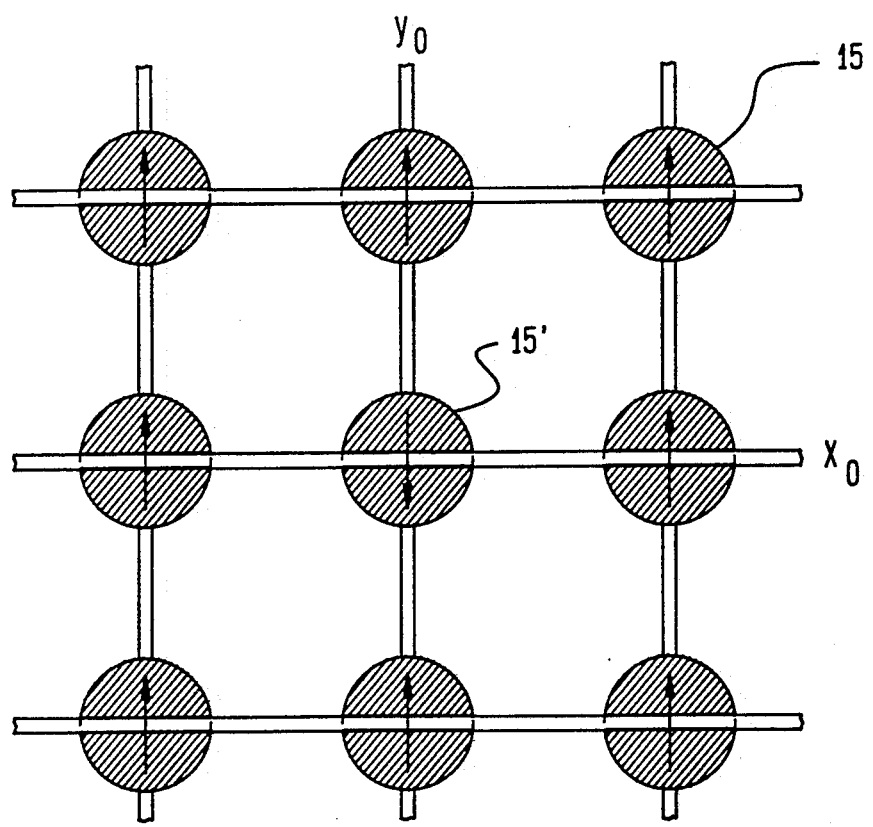
FIG. 4 is a plan view showing the basic configuration of memory using the conventional magnetic film pattern.
Figure 5:
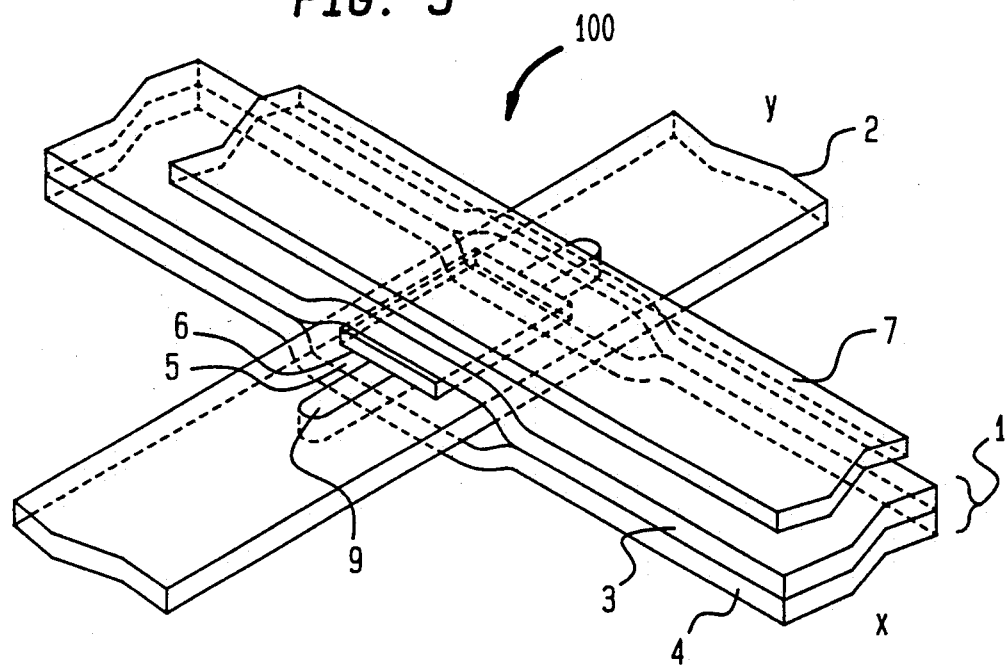
FIG. 5 is a perspective view showing the basic cell construction according to a first embodiment of the invention.
Figure 6:
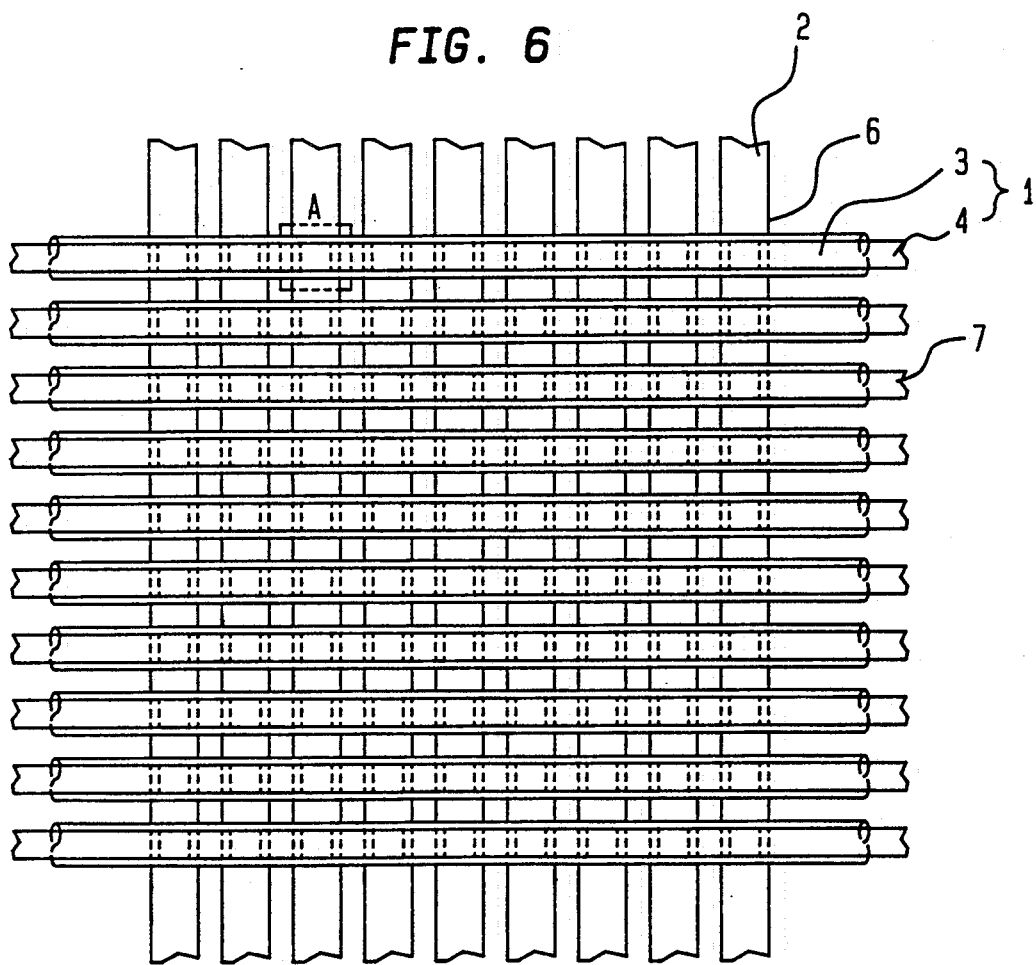
FIG. 6 is a plan view showing one example of a storage device with basic cells of FIG. 5 arranged in matrix.
Figure 7A:
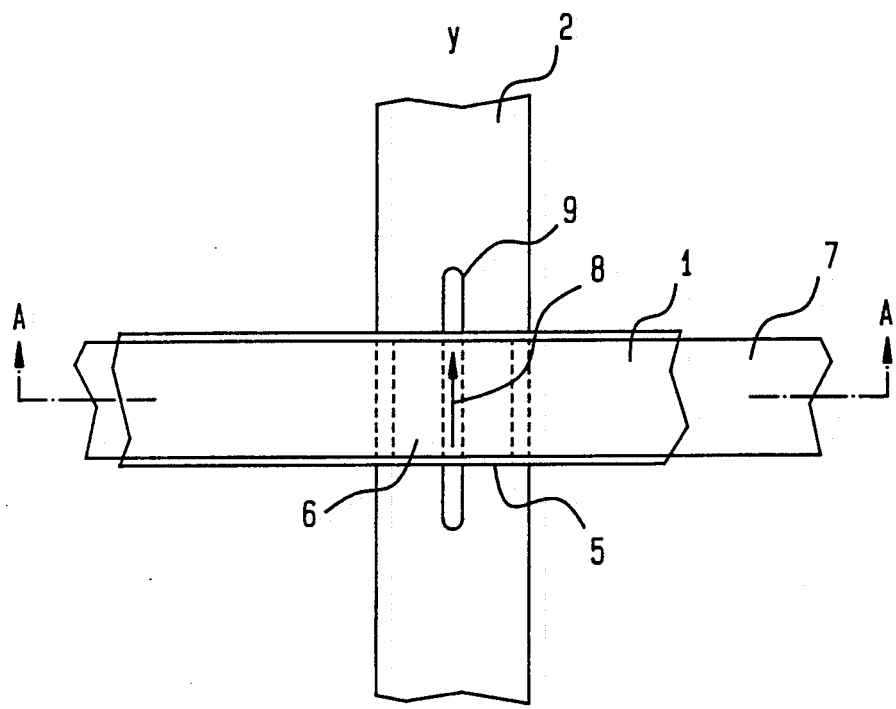
FIG. 7A is a plan view of FIG. 5.
Figure 7B:
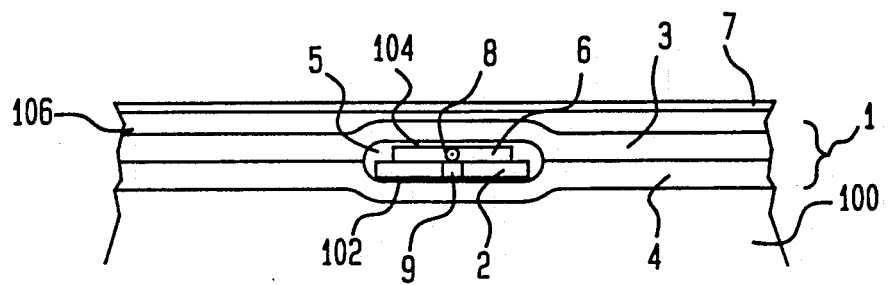
FIG. 7B is a cross-sectional view taken along the line A—A of FIG. 7A.

Referring to FIG. 5 and FIG. 7B, a superconductor layer is formed on a substrate 100 and patterned into third superconductor wires 4 extending in an X-axis direction. On the third superconductor wires 4 are formed second superconductor wires 2 with an insulating layer 102 interposed therebetween. A ferromagnetic film pattern 6 is formed on the second superconductor wire 2. On the magnetic film patterns 6 are formed first superconductor wires 3 with an insulating layer 104 interposed therebetween. The first superconductor wire 3 is fabricated so that it is insulated from a magnetic film pattern 6 and, where the second superconductor wire 2 is not provided, directly in contact with the third superconductor wire 4 beneath it, as shown in FIG. 5. Then, we obtain a superconductor ring 5 surrounding the magnetic film, with a Y-axis normal to the plane of the ring. On the first conductor wires 3 are formed another conducting wire (or superconductor wire) 7 with an insulating layer 106 disposed therebetween. And a number of unit cells of FIG. 5 are arranged in matrix to form a storage device as shown in FIG. 6.

In FIG. 6, a portion enclosed by a broken line A is a unit cell. A constraint on the unit cell size is that the thickness of the superconductor film forming the ring must be large as compared with the flux penetration depth. If currently available magnetic materials are used, the area of the superconductor ring, which is perpendicular to the ring's normal and whose periphery is defined by the inner wall of the ring, may be reduced to about 0.25 $\mu m^2$. To further reduce this area, the magnetic field strength of the order of $10^5$ Gauss is required to contain a unit magnetic flux quantum. To realize this in the magnetic pattern requires new magnetic material with a large 4 $\pi$Ms. Since there is no direct constraints on the width of the superconductor wire, the width can be reduced to 0.3 $\mu$m, which in turn reduces the size of the unit cell to approximately 0.5 $\times$0.5 $\mu$m.

The materials that may be used in this storage device of this invention include gold and aluminum as current conducting materials, Pb, Nb or ceramics of Ba-Y-Cu-O as superconductors materials, and $SiO_2$ as an insulating material. The magnetic film may be selected from a variety of well known materials such as Ni-Co-Fe alloy. The film preparation can be done by using one of known techniques. The above ceramics may be formed by various techniques such as sputtering or laser excited deposition. An etching technique may be a dry etching using, say, a chlorine gas.

Now, we will exlain the process of writing information. As an initial state, the magnetic material is magnetized to saturation in a predetermined direction. The magnetization along the Y-axis as indicated by 8 in FIG. 7A is taken to be positive.

The write operation is carried out as follows (FIGS. 7A and 7B). A pulse current is applied to the conductor wire 7 running along the X-axis and to the second superconducor wire 2 running along the Y-axis to reverse the direction of magnetization of the magnetic pattern 6 located at the intersection of the superconductor wires 1 and 2, from the positive of Y-axis direction shown in FIG. 7A to the negative direction. During the reversion of magnetization, the superconductor ring section 1 temporarily switches from the superconductor state to the normal conduction state so that the magnetized state of the superconductor ring 5 after reversion is stabilized by the diamagnetic current induced in the ring 5. This method takes a time of the order of 10 ns in writing one bit of data.

Next, the read operation will be explained, that is, an example of reading written information will be described. First, the magnetization direction of the magnetic film pattern is tilted from the easy axis (Y-axis) by the magnetic field produced by the current through the superconductor wire 2. By using a diamagnetic current induced in the superconductor ring during this rotation of magnetization and a bias current $I_b$ applied to the superconductor wire 1 during reading, the superconductor ring is switched from the superconductor state to the normal state to produce a voltage, which is read. Here it is preferred that the superconductor wire 2 passing through the ring 5 be formed with a hole 9 as shown in FIG. 5. The reason is to make almost zero the magnetic field induced in the magnetic pattern in the ring by the bias current $I_b$, thus minimizing the influence of the bias current $I_b$ on the magnetized state of the pattern.

Figure 8A:
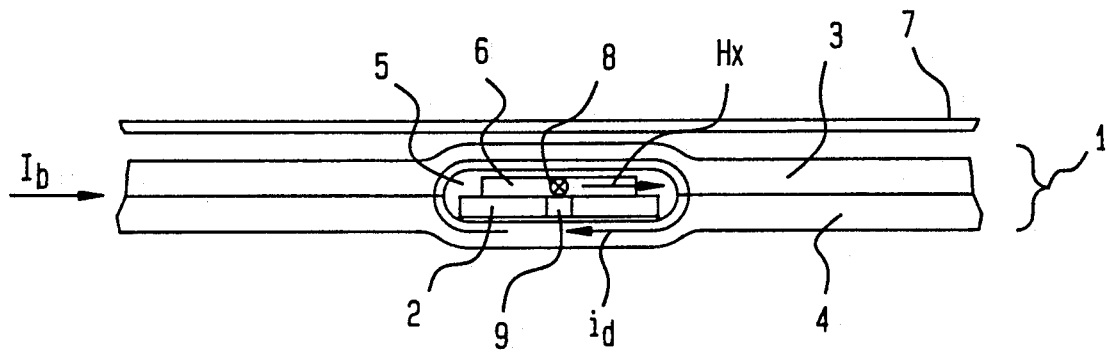
FIGS. 8A and 8B are cross-sectional views showing how information is read out.
Figure 8B:
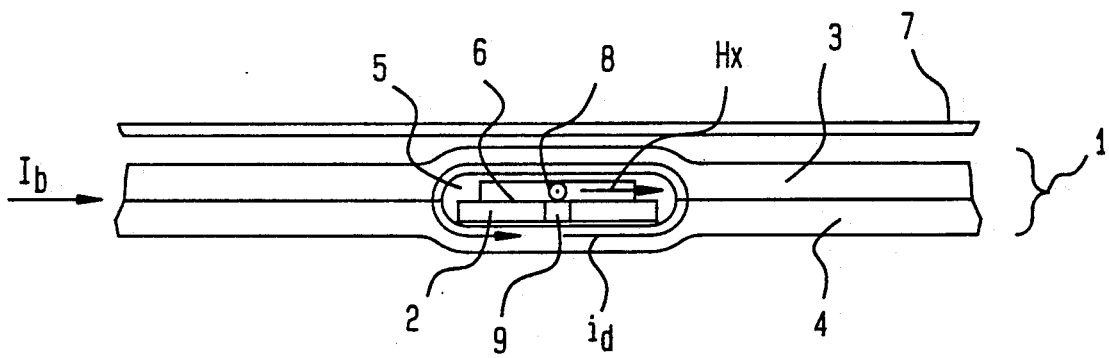

When reading out information, a dc bias current $I_b$ is applied to the superconductor ring 5 in the X-axis direction or positive direction, as shown in FIG. 8. Then, a current pulse is applied to the superconductor wire 2 extending in the Y-axis direction to impose a magnetic field $H_Y$ acting in the hard magnetization direction in the plane of the magnetic film pattern, causing the magnetization of the pattern to temporarily tile from the Y-axis direction. This produces a diamagnetic current $i_d$, which is either as shown in FIG. 8A or 8B depending on whether the stable magnetization direction is positive or negative with respect to the Y-axis direction. To sense the direction of the diamagnetic current, the superconductor rings in the storage device of this invention are each formed by using two kinds of superconductor materials 3, 4 with different critical currents. This permits discrimination between the clockwise and the counterclockwise diamagnetic current. The branches have almost the same self-inductances but for the clarity in the following discussion they are denoted $L_3$ and $L_4$. In the example of FIG. 8, the superconductor ring is formed by the superconductor wire 3 and the superconductor wire 4, the latter having a larger critical current than that of the wire 3. The bias current $I_b$ is branched into the paths 3 and 4 in roughly the following ratio.

$$L_4/(L_3+L_4)=A_3,\ L_3/(L_3+L_4)=A_4$$

The critical currents for the suerconductor wires 3, 4 are taken to be $I_{3C}$ and $I_{4C}$.

The read operation will be explained. When a bit magnetization is in a positive direction (FIG.8A), the diamagnetic current $i_d$—which is produced when the pulse current is applied to the Y-axis superconductor wire 2 to direct the pattern magnetization toward the X-axis—is in the same direction as the bias current $I_b$ in the superconductor ring in the region of a small critical current $i_d$ (superconductor wire 3 of FIG. 8). The bias current $I_b$ is preset to a value in a specified range so that when the magnetic film pattern is magnetized in the positive direction, the current $A_3 \cdot I_b + i_d$ exceeds the critical currennt $I_{3C}$ of the superconductor layer 3, causing it to switch to the normal state. Then, the bias current that was flowing through the path 3 now flows through the superconductor wire 4. That is, the superconductor layer 4 carries the whole bias current $I_b$. If $I_b$ is set to a large value compared with the critical current $I_{4C}$ of the superconductor layer 4, the ring becomes normal-state, producing a voltge between the ends of the ring.

On the other hand, when the pattern magnetization is in a reverse direction (FIG. 8B), the superconductor layer 3 carries only the current $A_3 \cdot I_b - i_d$ for the above value of the bias current, so that the layer 3 does not switch its state from superconducting to normal state. That is, no voltage is produced between the ends of the superconductor ring. In this way, the direction of magnetization of the magnetic film pattern can be determined.

Figure 9:
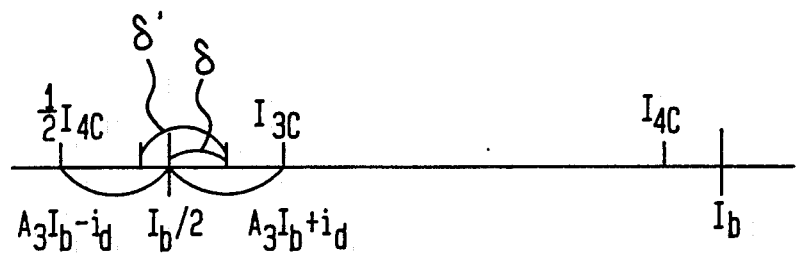
FIG. 9 is an explanatory diagram showing the relationship between the critical current of a superconductor wire and $I_b$ and $i_d$.

The above may be summarized as shown in FIG. 9. There must be the following relation established between the critical currents of the superconductor layers 3 and 4.

$$I_{4C}>A_3 \cdot I_b+i_d>I_{3C}>A_3 \cdot I_b-i_d>0$$

The bias current is set to meet the following relationship.

$$2I_{3C}>I_b>I_{4C}$$

From this, we obtain $$\tfrac{1}{2}I_{4C}<I_{3C}<I_{4C}$$

If the bias current $I_b$ is taken to be $$A_3 \cdot I_b=I_{3C}-\delta(0<\delta<i_d)$$

then, the requirement for the bias current $2\ I_{3C}>I_b>I_{4C}$ is satisfied. Also the following condition is met.

$$A_3 \cdot I_b+i_d>I_{3C}A_3 \cdot I_b-i_d$$

In addition, when we consider the relation $$I_{4C}>I_{3C}\delta+i_d>I_{3C}$$

the condition $I_{4C}>I_{3C}+i_d$ must be satisfied. This can be met if the following relation holds $$I_{3C}=\tfrac{1}{2}I_{4C}+\delta(\delta>0:\ \text{a very small value})$$

provided $I_{4C}$ is given as large a value as possible.

For example, the bias current $I_b$ is set at $I_b=17.5-10^{-3}$ A. When the diamagnetic current produced by excitation of the ferromagnetic film causes the superconductor ring to switch its state from superconductor to normal-state, the induced current flowing through the superconductor ring will be $0.25 \times 10^{-3}$ A, producing an output voltage across the normal-state ring. When the current applied to the Y-axis superconductor wire is cut off, the excitation of the magnetic film is removed, letting its magnetization return to the original direction.

Now, let us estimate the output voltage. Suppose the specific resistance $\rho$ of the superconductor is 200 to 250 $\mu\Omega$cm and the length of the superconductor 1 in the unit cell is 4 $\mu$m. Then the voltage V produced will be of the order of 10 mV. This is one digit higher than the voltage produced in bubble memory.

With this invention, it is possible to realize high-performance, high-density storage devices which are substantially improved on such conventional problems as instability of the magnetized state of unit cells when they are excited for reading and also instability of information caused by higher storage density.

In the embodiment of FIG. 5, the ring consisting of the first and third superconductor wires must be switched to the normal-state to reverse the magnetization of the magnetic film pattern. To cause the superconductor-to-normal-state switch, it is common practice to apply a superconductor forming the ring with a current higher than the critical current. In reducing the power consumption, the critical currents of the first and third superconductor wires should also be reduced as much as possible. Since the readout operation makes use of a difference in critical current between the first and third superconductor patterns, it is important to control the critical currents in the superconductor patterns. In this regard, the thicknesses of the first and third superconductor patterns may be made different from each other, instead of using different materials. Also, as shown in the second embodiment, it is possible to inject different levels of ions into one or both of the first and third superconductor patterns to make the critical currents different from each other.

Figure 10:
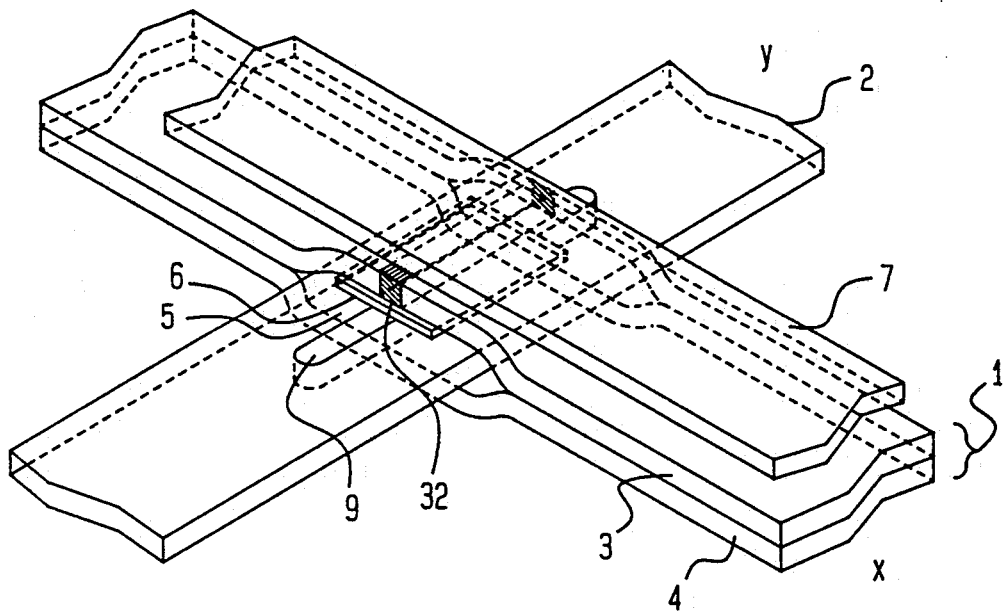
FIG. 10 is a perspective view showing the basic cell construction according to a second embodiment of the invention.

FIG. 10 shows another construction of a unit cell used in the storage device as a second embodiment of this invention. Like reference numerals are used on parts identical with those of FIG. 5.

Like the unit cell of FIG. 5, a second superconductor wire 2 is placed on a third superconductor wire 4 which runs in the X-axis direction, with an innsulator layer between them. On the second superconductor wire 2 is formed a ferromagnetic film pattern 6. On the film pattern 6 is formed a first superconductor wire 3 with an insulator layer between them.

The feature of the second embodiment is that a specified difference is produced between the critical currents of the first and third superconductor wires by injecting ions to a part 32 of the first superconductor wire 3 forming the ring to lower the superconducting-to-normal-state switch point and thereby reduce the critical current at a given temperature. It is also possible to inject different level of ions to both of the first and third superconductor wires to lower the critical currents of the first and third superconductor wires. The ions used may include $He^+$, $Ne^+$ and $H_2^+$. The proper amount of injection is between 1% and 3% in atomic percentage.

Figure 11:
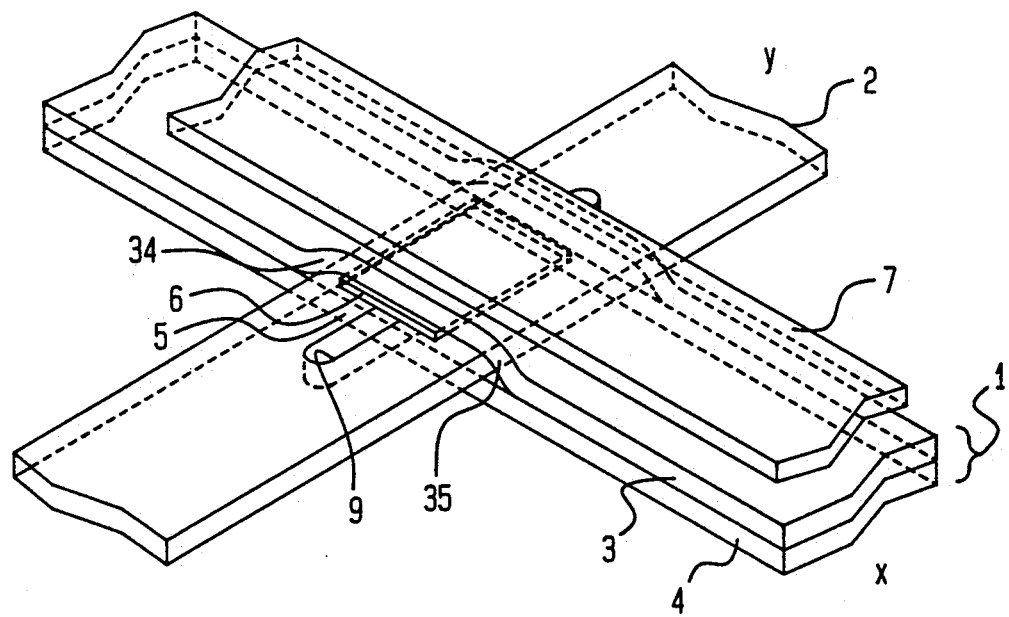
FIG. 11 is a perspective view showing the basic cell construction according to a third embodiment of the invention.

FIG. 11 shows a still another construction of a unit cell as a third embodiment of this invention. A third superconductor wire 4 running in the X-axis direction is formed flat. On the wire 4 is formed a second superconductor wire 2 with an insulator layer between them. On the second wire 2 is formed a ferromagnetic film pattern 6. On the film pattern 6 is formed a raised first superconductor wire 3 with an insulator layer interposed therebetween. The first superconductor wire 3 is formed in direct contact with the third superconductor wire 4 where there is no second superconductor wire 2, as shown in FIG. 11.

The feature of the third embodiment is that a difference is produced between the critical currents of the first and third superconductor wires 3 and 4 by forming current paths with small critical currents (current paths in the direction normal to the substrate plane) at stepped portions 34, 35 on each side of the ring to reduce the critical current of the first superconductor wire 3. This makes the critical current $I_{3C}$ of the first superconductor wire 3 at the ring smaller than the critical current $I_{4C}$ of the third superconductor wire 4.

In the second and third embodiments, the first and third superconductor wires may also be formed of different materials as in the first embodiment.

What is claimed is:

1. A magnetic memory element using a superconductive ring comprising:
   a first wire of superconductive material extending in a first direction;
   a second wire of superconductive material extending in a second direction so as to form a cross-over area between said first and second wires;
   a ferromagnetic film disposed between said first and second wires at said cross-over area and having a uniaxial anisotrophy along said second direction;
   a third wire of superconductive material extending in said first direction and sandwiching said ferromagnetic film and said second wire at said cross-over area, said third wire being contacted with said first wire so as to form a ring portion at said cross-over area;
   a fourth wire of conductive material extending in a first direction on said first wire;
   a first means for reversing a magnetized direction of said ferromagnetic film by applying first and second currents to said second and fourth wires, respectively;
   a second means for tilting said magnetized direction of said ferromagnetic film by applying a pulse current to said second wire so as to cause a diamagnetic current in said ring portion of said first and third wires;
   a third means for detecting a direction of said diamagnetic current by applying a bias current to said first and third wires from the same direction, a critical current of said third wire being larger than that of said first wire but smaller than said bias current so as to switch a superconductive state of said ring portion into a normal conductive state when the sum of said diamagnetic current and a partial current of said bias current passing through said first wire at said ring portion exceeds a critical current of said first wire at said ring portion.

2. A magnetic memory element as claimed in claim 1, wherein said first wire has an ion-injected region at said ring portion.

3. A magnetic memory element as claimed in claim 1, wherein said second wire has a slit below said ferromagnetic film.

4. A magnetic memory element as claimed in claim 1, wherein said first wire has a pair of stepped regions at said ring portion.

* * * * *